(12) United States Patent  (10) Patent No.: US 8,143,578 B2
Tidrow et al.  (45) Date of Patent: Mar. 27, 2012

(54) FERROELECTRIC RADIATION DETECTOR EMPLOYING FREQUENCY MODULATED READOUT

(75) Inventors: Steven C. Tidrow, Edinburg, TX (US); Frank Crowne, Laurel, MD (US); Daniel Potrepka, Silver Spring, MD (US); Bernard J. Rod, Potomac, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 371 days.

(21) Appl. No.: 12/427,295

(22) Filed: Apr. 21, 2009

(65) Prior Publication Data

US 2010/0264325 A1  Oct. 21, 2010

(51) Int. Cl.
*H01L 37/00*  (2006.01)
(52) U.S. Cl. .................................................. 250/338.2
(58) Field of Classification Search .......... 250/330–335, 250/336.1–336.2, 338.1–338.5, 339.01–339.15, 250/340, 341.1–341.8
See application file for complete search history.

(56) References Cited

U.S. PATENT DOCUMENTS

| | | |
|---|---|---|
| 3,568,010 A | 3/1971 | Maserjian |
| 3,611,130 A | 10/1971 | Larsen et al. |
| 3,676,754 A | 7/1972 | Maserjian et al. |
| 3,814,999 A | 6/1974 | Lawless et al. |
| 4,080,532 A | 3/1978 | Hopper |
| 4,143,269 A | 3/1979 | McCormack et al. |
| 4,464,065 A | 8/1984 | Wolf et al. |
| 4,592,880 A | 6/1986 | Murakami |
| 4,745,278 A | 5/1988 | Hanson |
| 4,792,681 A | 12/1988 | Hanson |
| 4,902,895 A | 2/1990 | Hanson |
| 4,996,104 A | 2/1991 | Nichols et al. |
| 5,530,247 A | 6/1996 | McIver et al. |
| 5,825,029 A | 10/1998 | Agnese et al. |
| 5,959,298 A | 9/1999 | Belcher et al. |
| 5,999,122 A | 12/1999 | Shoucri et al. |
| 6,080,987 A | 6/2000 | Belcher et al. |
| 6,091,050 A | 7/2000 | Carr |
| 6,208,288 B1 | 3/2001 | Shoucri et al. |
| 6,388,255 B1 | 5/2002 | Di Maio et al. |
| 6,534,767 B1 | 3/2003 | Di Maio et al. |
| 6,576,904 B1 | 6/2003 | Volkening |
| 7,667,200 B1 * | 2/2010 | Watts et al. ................ 250/338.1 |
| 2001/0003356 A1 | 6/2001 | Yon et al. |
| 2003/0066967 A1 | 4/2003 | Hashimoto et al. |
| 2003/0132386 A1 | 7/2003 | Carr et al. |
| 2004/0227089 A1 * | 11/2004 | Kolodzey et al. .......... 250/341.8 |
| 2008/0165565 A1 * | 7/2008 | Gunter et al. ................ 365/145 |

* cited by examiner

*Primary Examiner* — Kiho Kim
(74) *Attorney, Agent, or Firm* — Alan I. Kalb

(57) ABSTRACT

A detector for electromagnetic radiation such as millimeter wave and infrared employs a ring-shaped ferroelectric element having a temperature affected by an absorber for the radiation. The dielectric constant of the ferroelectric material is a strong function of the temperature near its Curie temperature. The resonant frequency of the ferroelectric element is detected by applying a swept-frequency signal to the circuit and detecting the frequency which enhances the energy of the pulse. A two-dimensional camera for the radiation employs a two-dimensional array of these ferroelectric resonant circuits and a system for rapidly interrogating their resonant frequencies on a sequential basis.

7 Claims, 5 Drawing Sheets

FERROELECTRIC RADIATION DETECTOR EMPLOYING FREQUENCY MODULATED READOUT

GOVERNMENT INTEREST

The invention described herein may be manufactured, used, and licensed by or for the United States Government.

FIELD OF THE INVENTION

This invention relates to elements and systems incorporating these elements for measuring electromagnetic radiation, particularly at frequencies in the millimeter wave range, specifically elements that employ ferroelectric components whose temperatures, and thus their dielectric constants, are affected by absorbers of the radiation in contact with them, the elements forming part of resonant circuits, and to techniques for measuring the resonant frequencies of these circuits using swept-frequency techniques.

BACKGROUND OF THE INVENTION

It has previously been proposed to provide detectors for electromagnetic energy, and particularly millimeter wave and infrared radiation that exploit the temperature-sensitive properties of ferroelectric devices. For example, U.S. Pat. No. 4,902,895 discloses a system wherein a ferroelectric material is placed between two electrodes or plates to form a capacitor and the charge accumulated in the capacitor during exposure to radiation is read out to measure the radiation. In U.S. Pat. No. 5,530,247 similar elements are incorporated into a two-dimensional array so that the charge build-up in the ferroelectric layers during exposure to radiation may be converted to a readable image and displayed by video screen. U.S. Pat. No. 6,534,767 includes a ferroelectric element connected in a resonant circuit. The resonant frequency of the circuit, which varies with the radiation incident on the ferroelectric element, is tracked by a phase-locked loop.

These systems are inherently expensive and relatively slow in operation. Independently, technologies for measuring frequency have advanced so significantly in recent years that systems based on frequency measurements have become highly precise, very fast in operation, and relatively low in cost.

SUMMARY OF THE INVENTION

The present invention takes advantage of modern frequency measurement techniques. It provides a system for measuring radiation, particularly in the millimeter and infrared wavelengths, that is extremely precise, simple in implementation and relatively low in cost. The system employs ferroelectric elements maintained in a constant temperature chamber at a temperature near their Curie temperature. Preferably their composition is such that this is near ambient temperature in order to reduce the power consumption required to maintain the temperature controlled chamber. A window in the chamber allows incoming radiation to fall on radiation absorbers associated with each of the ferroelectric elements. Radiation absorbers may be chosen that are frequency selective and that result in detectors that are sensitive to selected frequencies of radiation. The temperatures of these absorbers are increased in proportion to the radiation they absorb, thereby changing the temperatures of the ferroelectric elements and thus their dielectric constants. The ferroelectric elements are arranged in resonant circuits such that the resonant frequency of a given circuit shifts sharply as its associated ferroelectric element is heated and its temperature is changed relative to its Curie temperature.

In order to read out the change in resonant frequency of a given circuit due to heating of the associated ferroelectric element, which arises from the radiation incident on the element through the window of the temperature-controlled chamber, a constant-amplitude swept-frequency signal or "chirp" is applied to the circuit. The time-domain response of the resonant circuit to the chirp is no longer a constant-amplitude signal: at the instant at which the instantaneous frequency of the chirp sweeps through the resonance frequency, the amplitude develops a spike. If this output is applied to a circuit that records the position of the spike in time relative to the start of the original chirp, the resulting signal is a measurement of the resonant frequency of the circuit. Because this signal is a function of the temperature of the absorber, it records the level of incoming radiation at the absorber.

In one embodiment of the invention a plurality of the ferroelectric elements and associated absorbers are arranged in rows as "pixels" in a two-dimensional array. Each pixel consists of a ferroelectric element and its individual resonant circuit. A train of chirps is generated, each of which interrogates a specific row of the array. Each of the pixels in a given row is designed with different dimensions to differ slightly in resonant frequency with no incident radiation, so that each interrogation chirp in the sequence develops a series of spikes, one per pixel in the row. These spikes record the respective resonant frequencies of the pixels or circuits in that row, and thus the levels of incident radiation at the corresponding pixels. The output signal of a single "scan" of the array is a serial train of pulses, like the output from a CCD array. A "template" signal consisting of the output of the full array for uniform illumination at some reference radiation level (also called a "replica" in the radar literature) can be stored in a computer and used for comparison with the real array output; such a comparison will reveal shifts in the spike positions, which record the thermal contrast of the scene relative to the uniform illumination. These shifts may be used to generate a two-dimensional visual display of the incoming radiation pattern.

BRIEF DESCRIPTION OF THE DRAWINGS

Other objects, advantages and applications of the present invention will be made apparent by the detailed description of a preferred embodiment of the present invention. The description makes reference the accompanying drawings in which.

DESCRIPTION OF THE PREFERRED EMBODIMENTS

Figure 1:
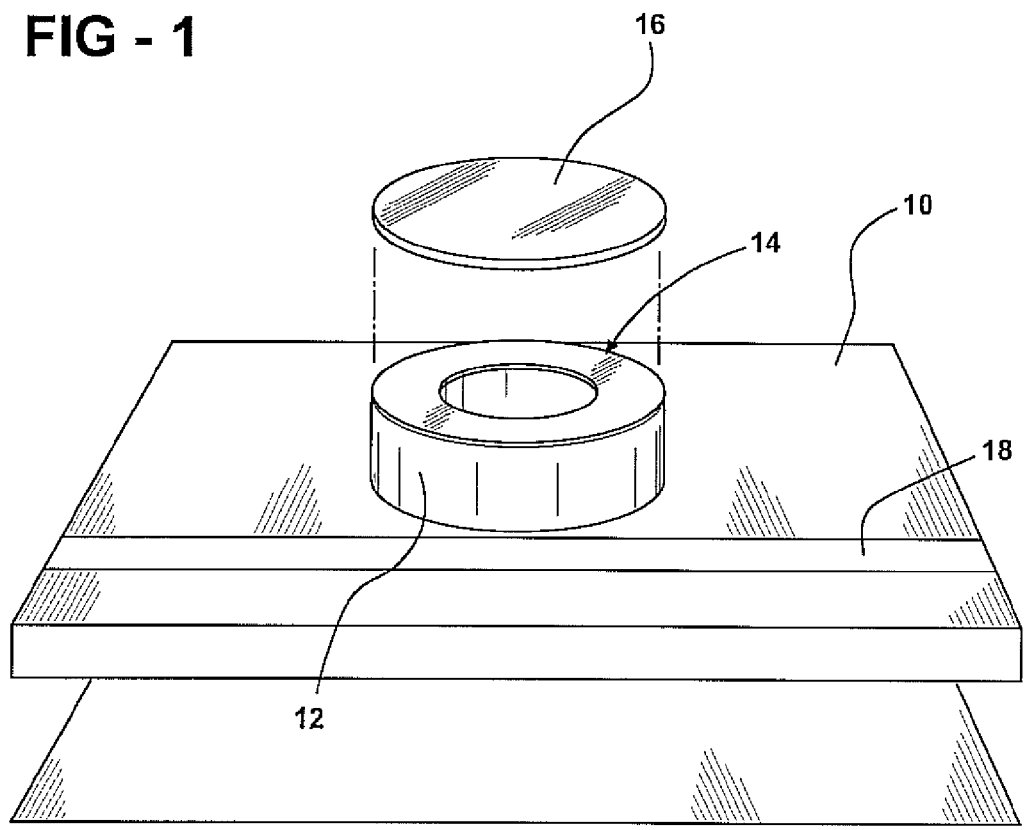
FIG. 1 is a perspective view of the radiation detector of the preferred embodiment of the invention in partially exploded view.

Referring to the drawings, a preferred embodiment of the radiation sensor of the present invention is constructed on top of a planar ground plane 8, which may be made of a metal such as copper. A dielectric layer 10 is placed on the ground plane, and a metal microstrip transmission line 18 is placed on the dielectric layer 10. A cylindrical mesa 12 of dielectric material is built up on the dielectric layer 10. A ferroelectric ring 14 having a similar outer diameter as the mesa 12 is formed on the top of the mesa. These two dielectric structures together act as a single dielectric resonator, whose resonant frequency will change with temperature due to the change in dielectric constant of primarily the temperature sensitive ferroelectric ring 14. The ring 14 may be replaced by a disc or any other shape capable of forming a resonant structure or cavity in other embodiments of the invention. A preferred material for the ferroelectric ring 14 is barium strontium titanate having the chemical formula $Ba_{1-x}Sr_xTiO_3$. The composition of the ferroelectric, i.e., the concentration of strontium x, is preferably adjusted so that the Curie temperature of the material is close to that of the ambient temperature to reduce the power requirements for the constant temperature chamber. Other appropriate ferroelectric materials may be used in place of $Ba_{1-x}Sr_xTiO_3$ especially when the ambient temperature is above about 120° C. for $BaTiO_3$ or below about 90 K for $SrTiO_3$ or in order to improve other design properties. The ferroelectric ring may have a thickness in the range 0.1-100 microns. The diameter and thickness of the ring and mesa determine the resonant frequency of the resonator pixel in the circuit, whose values are chosen so that the value is identified with a particular resonator position in the detector array. The top of the ferroelectric ring is covered with a radiation absorber 16, of appropriate material for efficient transfer of the desired electromagnetic radiation to thermal heat. The resonant frequency of the structure may change but in a predictable manner due to the properties of the absorber material, dielectric constant for non-electrically conducting materials and boundary conditions if conducting materials like copper, gold or silver, are used for transforming radiation into thermal heat.

The composite resonator consisting of the dielectric mesa 12 and the ferroelectric ring 14 can couple to the microwave transmission line 18 simply by its proximity to the line if the latter passes close by. Alternatively, the line 18 can either stop at the edge of the mesa 12, then start again at a diametrically opposed point of the mesa 12 and continue on, or pass beneath the structure as a single uninterrupted strip of metal or be coupled using other geometries known in the literature.

Figure 2:
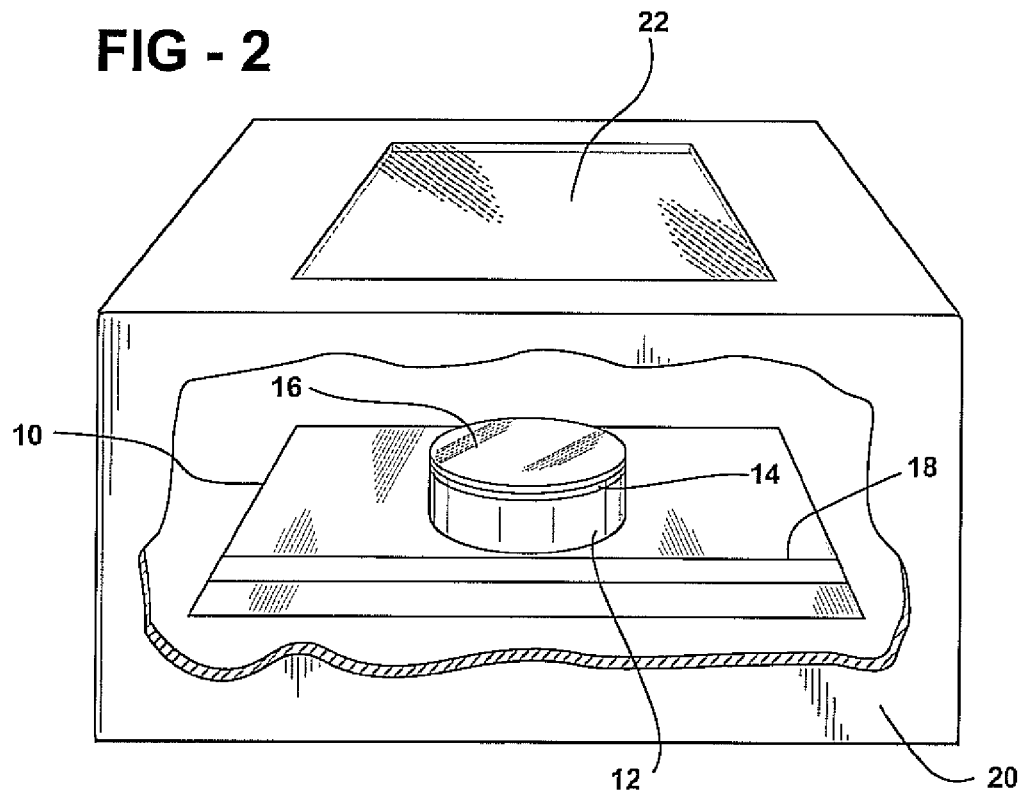
FIG. 2 is a perspective view, partially broken away, of the radiation detector of FIG. 1 located in a constant temperature chamber in accordance with the present invention.

As illustrated in FIG. 2 the radiation sensor of FIG. 1 is located within a controlled temperature chamber 20 which has a window 22 situated directly above the radiation absorber 16. This window is transparent to the radiation to be measured, so that incident radiation increases the temperature of the absorber 16.

In this configuration the ferroelectric ring 14 acts as a bandpass filter that will strongly transmit any signal whose wavelength satisfies the relationship $\lambda = 2\pi nr$ where n is an integer and r is the radius of the ring. This corresponds to a frequency $$f = \frac{c}{\lambda} = \frac{c}{2\pi nr\sqrt{\varepsilon}}$$

where $\varepsilon$ is the dielectric constant of the ferroelectric.

As the energy absorber layer is exposed to radiation in the preferred wavelength range, which may be either the millimeter range or in the infrared range depending upon the absorbing material 16, it converts the absorbed energy to heat. The resulting rise in temperature will change the effective $\varepsilon$, that predominately depends on the temperature sensitive ferroelectric material, and hence will shift the frequency of the resonator by an amount that depends on the intensity of the radiation. This frequency shift is thus a direct measure of the intensity of radiation falling on the absorber 16.

In order to determine the resonant frequency of a sensor subjected to radiation, and thus measure the intensity of the radiation, the resonant circuit formed by the ferroelectric element 14 is interrogated by a swept-frequency modulated signal or "chirp" that propagates along the microstrip 18. This signal is a constant-amplitude sinusoidal pulse with a frequency that varies within the pulse duration in either an increasing or decreasing manner. When such a chirp signal is applied to the circuit consisting of the ferroelectric element 14, the resonator will enhance the amplitude of the pulse at its resonant frequency as the pulse traverses the resonator. This will produce a spike in the output of the resonant circuit, which occurs at the time the swept frequency passes through the circuit's resonance. By identifying the frequency of the interrogating signal at the time the spike occurs in the output from the ferroelectric circuit, the resonant frequency of the circuit can be determined. The shift in this resonant frequency relative to the template signal determines the intensity of the illuminating radiation.

Since the ferroelectric material is fabricated so as to have a Curie point quite close to the ambient temperature background and kept constant by the chamber 20, the increase in thermal energy caused by incoming radiation on the absorber 16 will cause a large change in the dielectric constant of the ferroelectric, leading to a relatively large change in the resonant frequency of the resonant circuit for small changes in the intensity of the absorbed radiation.

Figure 3:
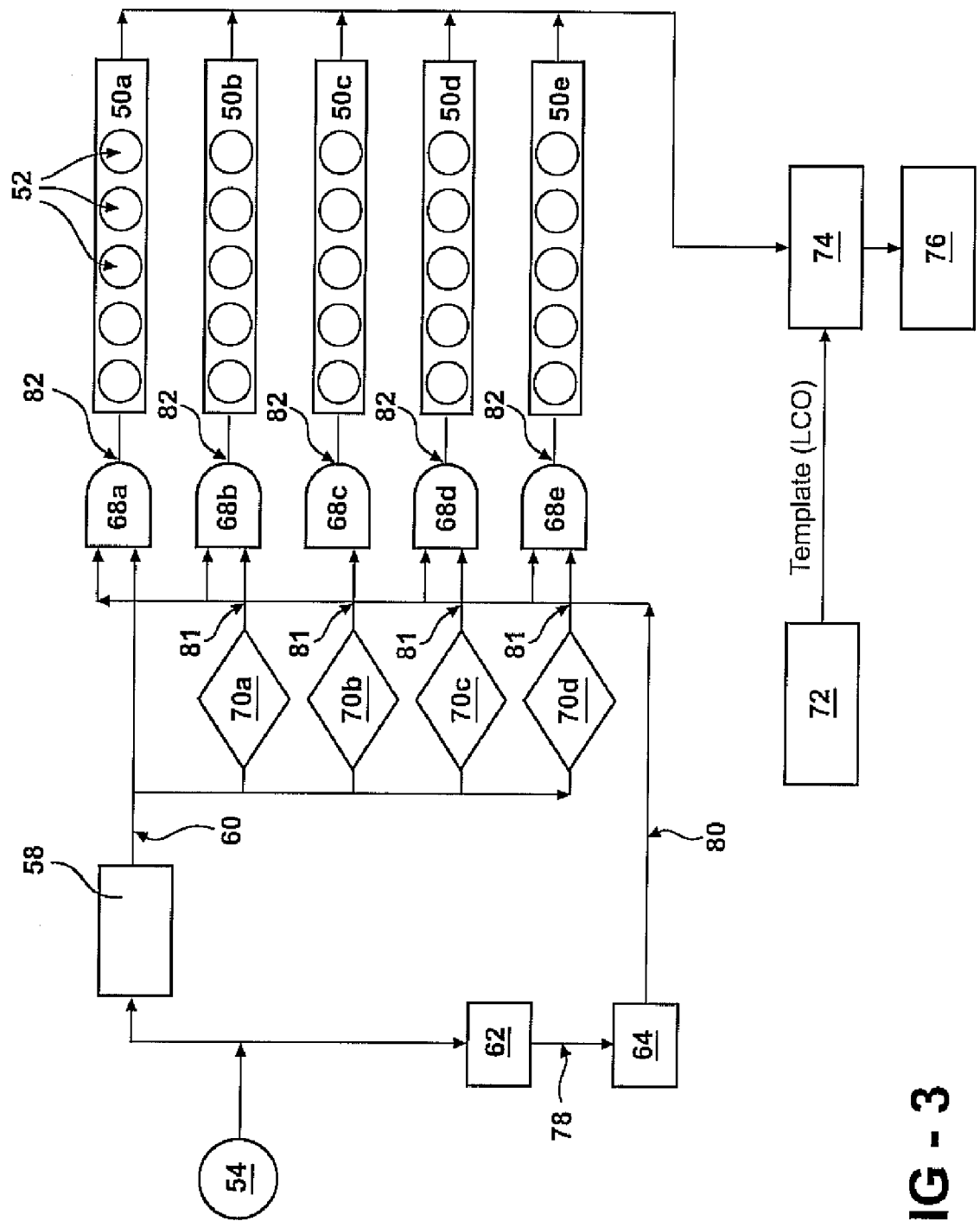
FIG. 3 is a schematic diagram of a system incorporating a two-dimensional array of radiation sensors of the type illustrated in FIG. 1, designed to sequentially interrogate the radiation sensors with chirp pulses to detect their resonant frequencies and generate a two-dimensional display based on the incident radiation on the display.

The swept-frequency technique may also be employed to interrogate a matrix of radiation sensors. FIG. 3 illustrates a circuit in which twenty-five radiation sensors of the type illustrated in FIG. 2 are arranged in a 5×5 array. Each row of the array, 50a, 50b, 50c, 50d, and 50e, henceforth referred to as a "stick", includes five sensor elements 52 connected in series. Each element 52 in the series is constructed so as to have a different resonant frequency. A system clock 54 produces clocking square waves 56, shown in FIG. 4, at a selected frequency, e.g., 5 KHz. The clock 54 is fed to a sawtooth generator 62 consisting of a simple integrating IC, which in turn provides output to a voltage controlled oscillator (VCO) 64.

The same clock drives a generator of "blanking pulses" 58, which allows every fifth clock pulse to pass and blocks the next four clock pulses. This blanking signal 60 (FIG. 4) is sent to the first of a series of five AND gates 68a, 68b, 68c, 68d, 68e, and simultaneously is fed to delay lines 70a, 70b, 70c and 70d. The outputs of these lines are versions of the blanking signal 60, delayed by one, two, three, and four clock pulses. These signals successively enable the AND gates 68a-68e to pass the signal from the voltage controlled oscillator 64, which thus feeds chirps from the oscillator sequentially to their associated sticks 50a-50e. Thus a chirp passes through the sensor line 50a, then a chirp passes through the sensor line 50b, next a chirp passes through the line 50c, then 50d, and finally 50e. The outputs of the sensor lines, which will contain amplitude spikes as the chirps pass through the resonant frequencies of the sensors 52 forming part of each line, are sent to a correlator 74 along with a signal stored in a computer 72, called a "replica", which preferably represents a uniform scene at the average temperature of the scene under surveillance. Alternatively it may represent the outputs with no incident radiation. The output of this correlator is a series of amplitude pulses that can be fed to a vidicon 76, where the scene imaging takes place, perhaps with color associated with each frequency for ease of observation.

Figure 4:
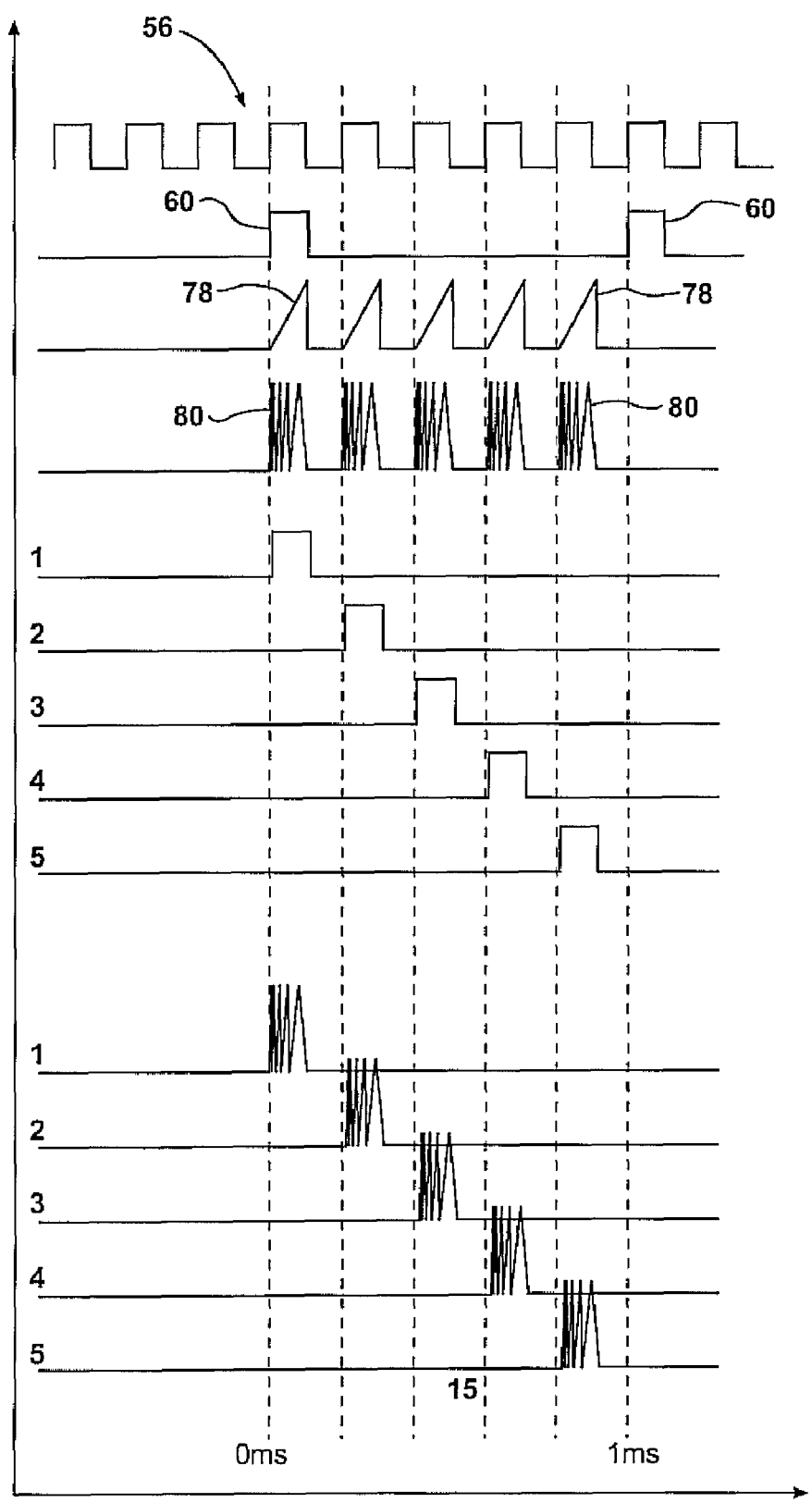
FIG. 4 is a plot of waveforms occurring in the circuit of FIG. 3.

The waveforms produced by the circuit of FIG. 3 are illustrated in FIG. 4. The first line illustrates the clock outputs from the clock 56. The blanking circuit produces the signal 60 shown on the second line. The clock signal also feeds the sawtooth generator 62, which produces the sawtooth signal 78. This signal drives the VCO, which in turn produces the sequence of chirp signals 80 shown in the next line. These chirps are applied to the adders 68*a*-68*e* and gated into the five sensor lines 50*a*-50*e*.

Figure 5A:
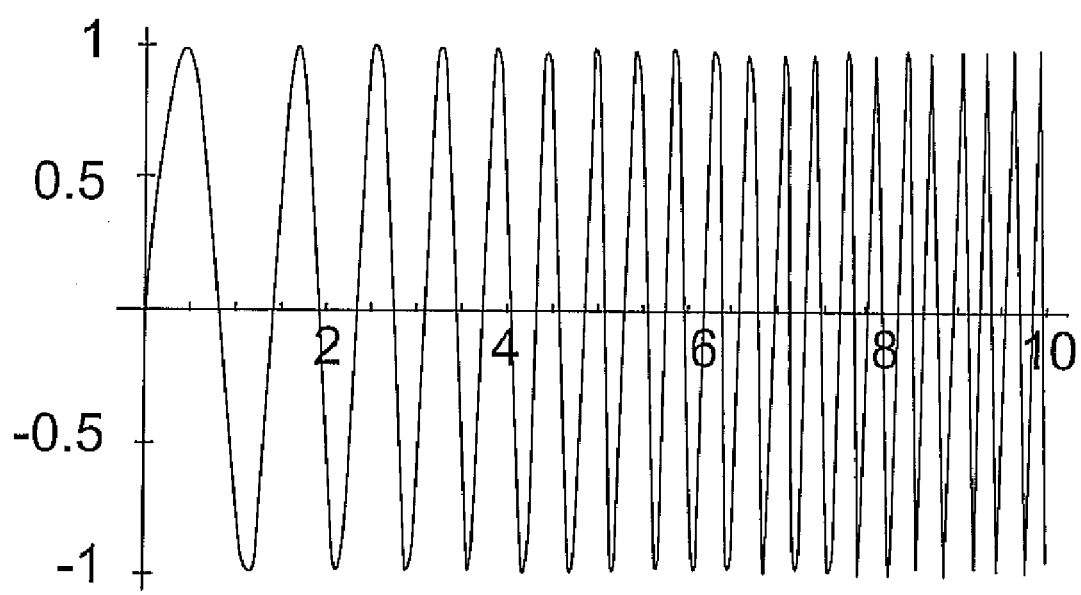
FIG. 5a-FIG. 5d are plots of typical input and output signals from the circuit elements.
Figure 5B:
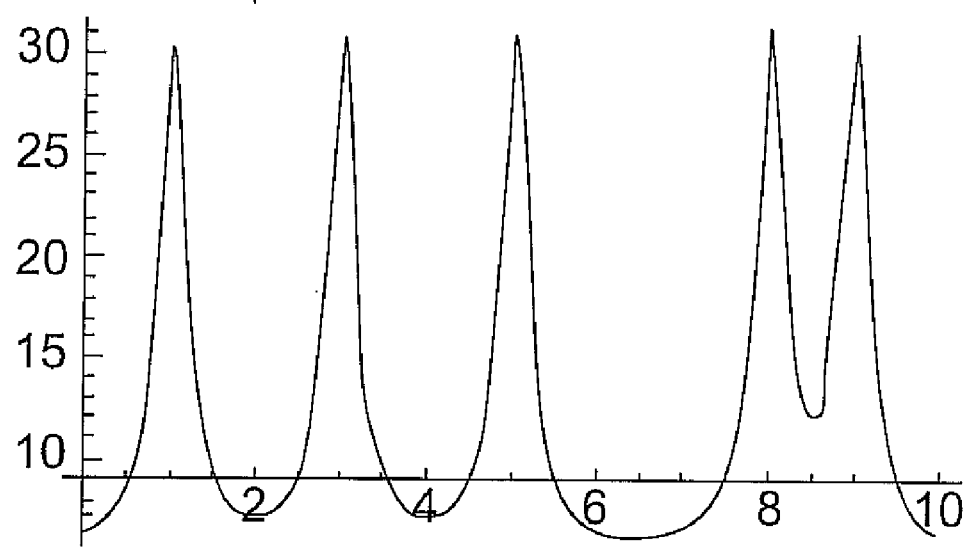
Figure 5C:
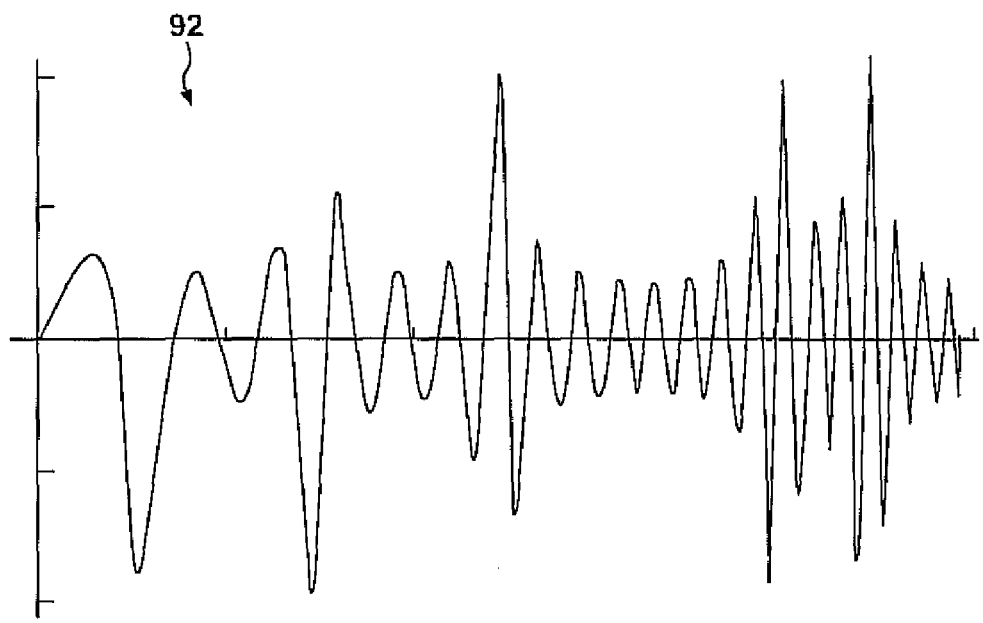
Figure 5D:
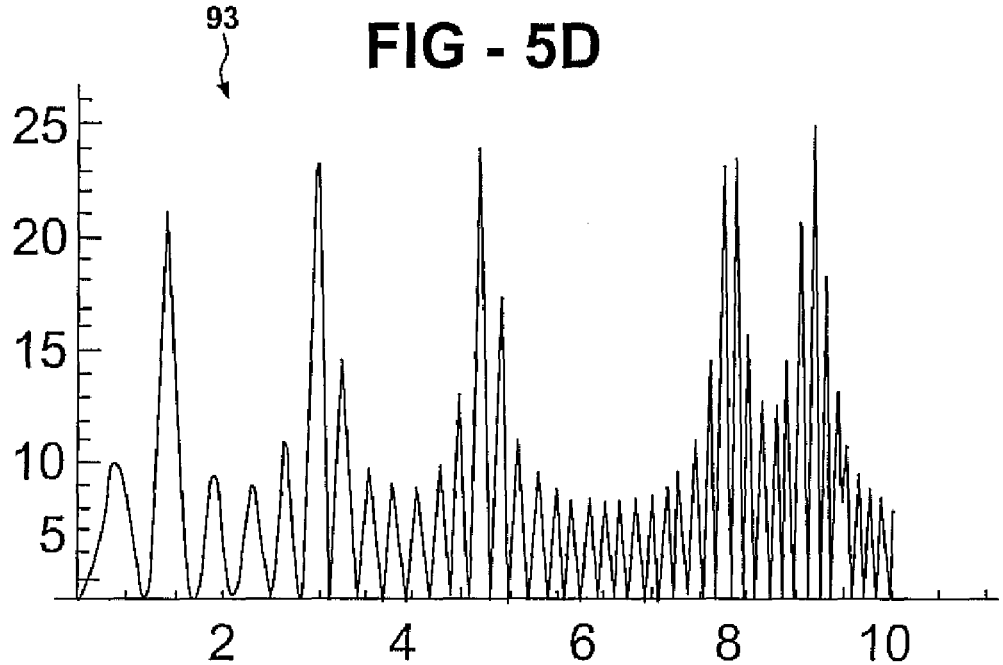

FIGS. 5*a-d* shows typical output signals to and from the circuit elements. The constant amplitude chirp signal 90 of FIG. 5*a* is shown in FIG. 5*b* as distorted by the frequency spectrum 91 of the chain of resonators in the stick (each peak in the trace 91 derives from an individual resonator) and exits the stick looking like the trace 92 of FIG. 5*c*. After correlation, the signal 93 of FIG. 5*d* shows strong amplitude peaks that can be smoothed by a low-pass filter (not shown) and sent to the vidicon 76.

Having thus described our invention, we claim:

1. A method for constructing a resonant frequency electromagnetic radiation detector comprising the following steps:
   providing a planer ground plane;
   placing a dielectric layer on said planer ground plane;
   placing a metal microstrip transmission line on said dielectric strip;
   building up a mesa formed of dielectric material on said dielectric layer;
   forming a ferroelectric ring on top of said mesa; and
   placing a radiation absorbing layer on top of said ferroelectric ring.

2. The method of claim 1 wherein said planer ground plane is capable of supporting a resonate mode.

3. The method of claim 1 wherein said planer ground plane is formed of copper.

4. The method of claim 1 wherein said mesa is formed in a substantially cylindrical shape.

5. The method of claim 4 wherein said ferroelectric ring is formed to have a substantially similar diameter as that of said mesa.

6. The method of claim 1 wherein said ferroelectric ring is formed of Barium Strontium Titanate.

7. The method of claim 1 wherein said ferroelectric ring has a thickness in the range of 0.1-100 microns.

* * * * *